(12) United States Patent
Iravani et al.

(10) Patent No.: US 10,069,417 B2
(45) Date of Patent: Sep. 4, 2018

(54) POWER CONVERSION DEVICE WITH INTEGRATED DISCRETE INDUCTOR

(71) Applicants: KINETIC TECHNOLOGIES, San Jose, CA (US); SILICON FIDELITY, INC., Cupertino, CA (US)

(72) Inventors: Farshid Iravani, Cupertino, CA (US); Kin Shum, Palo Alto, CA (US); Jan Nilsson, Sunnyvale, CA (US); William Robert Pelletier, Campbell, CA (US)

(73) Assignees: Kinetic Technologies, San Jose, CA (US); Silicon Fidelity, Inc., Cupertino, CA (US)

( * ) Notice: Subject to any disclaimer, the term of this patent is extended or adjusted under 35 U.S.C. 154(b) by 0 days.

(21) Appl. No.: 15/395,708

(22) Filed: Dec. 30, 2016

(65) Prior Publication Data

US 2017/0194861 A1    Jul. 6, 2017

Related U.S. Application Data

(60) Provisional application No. 62/274,554, filed on Jan. 4, 2016.

(51) Int. Cl.
*H02M 3/158*    (2006.01)
*H02M 3/00*    (2006.01)

(52) U.S. Cl.
CPC ............ *H02M 3/158* (2013.01); *H02M 3/00* (2013.01); *H02M 3/1588* (2013.01);
(Continued)

(58) Field of Classification Search
CPC ..................................................... H01L 25/117
See application file for complete search history.

(56) References Cited

U.S. PATENT DOCUMENTS

| 6,885,278 B2 | 4/2005 | Nakao et al. |
| 7,489,223 B2 | 2/2009 | Yokoyama et al. |

(Continued)

FOREIGN PATENT DOCUMENTS

| TW | 200408101 | 5/2004 |
| TW | 200849504 | 12/2008 |
| TW | 201130094 | 9/2011 |

OTHER PUBLICATIONS

Search Report for Taiwan Application No. 106100207, dated Sep. 27, 2017, 2 pages.

(Continued)

*Primary Examiner* — Jeffrey Zweizig
(74) *Attorney, Agent, or Firm* — Sheppard Mullin Richter & Hampton LLP

(57) ABSTRACT

A switching regulator may include an inductor housing, a board, and one or more electrical components. The inductor housing may house an inductor and one or more wires. The board may include one or more board traces and one or more solder pads. The electrical components may include one or more chips, capacitors, voltage sources, and/or other electrical components. The inductor housing may be attached to the board to create a space between the inductor housing and the board. The space may be created underneath the inductor housing and above the board. One or more electrical components may be attached to the board. One or more electrical components may be disposed within the space.

20 Claims, 9 Drawing Sheets

(52) U.S. Cl.
CPC ............... *H01L 2224/16225* (2013.01); *H01L 2224/48091* (2013.01); *Y02B 70/1466* (2013.01)

(56) References Cited

U.S. PATENT DOCUMENTS

| | | |
|---|---|---|
| 7,786,837 B2 | 8/2010 | Hebert |
| 8,004,070 B1 * | 8/2011 | Chen ................. H01L 23/49551 257/676 |
| 8,067,822 B2 | 11/2011 | Luo et al. |
| 8,338,933 B2 | 12/2012 | Chen et al. |
| 8,946,886 B1 | 2/2015 | Fuentes et al. |
| 9,190,383 B2 * | 11/2015 | Cho ........................ H01L 24/49 |
| 9,437,570 B2 * | 9/2016 | Cho ........................ H02M 3/155 |
| 9,515,014 B2 * | 12/2016 | Cho ........................ H01L 28/10 |
| 9,565,768 B2 * | 2/2017 | Cho |
| 9,607,917 B2 | 3/2017 | Moussaoui et al. |
| 2010/0084750 A1 | 4/2010 | Lotfi et al. |
| 2012/0262145 A1 | 10/2012 | Chen et al. |
| 2015/0116973 A1 | 4/2015 | Chen et al. |
| 2015/0162297 A1 | 6/2015 | Cho et al. |

OTHER PUBLICATIONS

Micrel Inc., "MIC33030: 8MHz 400mA Internal Inductor Buck Regulator with HyperLight Load," product information, Mar. 2015 [retrieved online at https://web.archive.org/web/20150511112821/ http://www.micrel.com/products/power-management-ics/regulators-with-internal-inductor/article/1-mic33030.html on Jan. 27, 2017].

Texas Instruments Incorporated, "LMZ10500 650-mA Simple Switcher® Nano Module With 5.5-V Maximum Input Voltage," product data sheet, Feb. 2015 [retrieved online at http://www.ti.com/lit/ds/symlink/lmz10500.pdf on Jan. 27, 2017].

Texas Instruments Incorporated, "TPS6274x 360nA IQ Step Down Converter for Low Power Applications," product data sheet, Jul. 2014 [retrieved online at http://www.ti.com/lit/ds/symlink/tps62740.pdf on Jan. 27, 2017].

First Office Action for Korean Application No. 10-2017-0000929, dated Mar. 20, 2018, 10 pages.

* cited by examiner

POWER CONVERSION DEVICE WITH INTEGRATED DISCRETE INDUCTOR

CROSS-REFERENCE TO RELATED APPLICATIONS

This application claims the benefit of U.S. Provisional Application Ser. No. 62/274,554, filed Jan. 4, 2016, and entitled "POWER CONVERSION DEVICE WITH INTEGRATED DISCRETE INDUCTOR." The entirety of the aforementioned application is incorporated herein by reference.

TECHNICAL FIELD

The present disclosure generally relates to a technical field of semiconductor devices, and particularly to power conversion devices with integrated discrete inductors.

BACKGROUND

Voltage regulators, such as DC to DC converters, are used to provide stable voltage sources for electronic systems. Efficient DC to DC converters are particularly needed for low power devices. One type of DC-to-DC converters is a switching voltage regulator. A switching voltage regulator generates an output voltage by alternately coupling and decoupling an input DC voltage source with a load. The coupling and decoupling action can be performed by a switch, while a low pass filter comprising a capacitor and an inductor can be used to filter the output of the switch to provide a DC output voltage.

FIG. 1 shows an example implementation of a "buck" type switching regulator, which can perform a DC-DC down conversion. Referring to FIG. 1, circuit 100 includes a voltage source 103, a switching regulator 102 and a load 113. Switching regulator 102 is coupled to the voltage source 103 through an input terminal 114. Switching regulator 102 is also coupled to the load 113, which can be another electronic circuit that draws current, via an output terminal 112. Switching regulator 102 includes a switching circuit 116, which serves as a power switch for alternately coupling and decoupling input terminal 114 to an intermediate terminal LX node 109. Switching circuit 116 includes a first transistor 107 and a second transistor 108. Typically both transistors 107 and 108 can be implemented as metal oxide semiconductor field effect transistor (MOSFETs). Transistor 107 has a drain connected to input terminal 114, a source connected to an intermediate terminal 109, and a gate connected to a control line 105. Transistor 108 has a drain connected to intermediate terminal LX node 109, a source connected to a low voltage potential 115 (e.g. a ground), and a gate connected to a control line 106.

Switching regulator 102 includes a controller 104 to control the operation of switching circuit 116 via control lines 105 and 106. Switching regulator 102 also has an output filter 117, which includes an inductor 110 connected between intermediate terminal 109 and output terminal 112, and a capacitor 111 connected in parallel with load 113. Controller 104 causes switching circuit 116 to alternate between a first conduction period, where first transistor 107 is enabled and second transistor 108 is disabled to bring intermediate terminal 109 to a voltage substantially equal to the input voltage, and a second conduction period, where first transistor 107 is disabled and second transistor 108 is enabled to bring intermediate terminal 109 to a voltage substantially equal to that of low voltage potential 115. This results in a rectangular waveform, which toggles substantially between input voltage and a voltage equal to voltage potential 115, at LX node 109, which can act an intermediate terminal. LX node 109 is coupled to output terminal 112 via output filter 117. Output filter 117 converts the rectangular waveform at intermediate terminal 109 to a substantially DC voltage at output terminal 112. The magnitude of the output DC voltage at terminal 112 depends on the duty cycle of the rectangular waveform at intermediate terminal 109.

With widespread use of BCD (Bipolar-CMOS-DMOS) technology, it is common to integrate controller 104, switching circuit 116, as well as high precision feedback circuit (not shown in FIG. 1) on a single controller chip. The controller chip can have an output port that corresponds to the LX node 109. The controller chip can then be connected to a discrete inductor (e.g., inductor 110) at the output port that corresponds to the LX node 109 to form the switching regulator 102. The external inductor can also be connected to other discrete components (e.g., capacitor 111) to form an output terminal (e.g., output terminal 112) of the switching regulator 102.

FIG. 2 illustrates a way of placing the controller chip and the discrete components on a printed circuit board (PCB) to form the switching regulator 102 of FIG. 1. As shown in FIG. 2, system 200 includes a controller chip 202 which can include, for example, controller 104 and switching circuit 116 of FIG. 1. System 200 also includes capacitor 111, and inductor 110 of FIG. 1. FIG. 2 also illustrates a number of board traces and solder pads arranged to be LX node 109, vout 112, yin 114, and GND 115 of FIG. 1. System 200 also includes a capacitor 203 (not shown in FIG. 1) connected to yin 114 to act as a by-pass capacitor to further reduce the switching noise at that node. As shown in FIG. 2, controller chip 202, is placed adjacent to capacitors 111 and 203. Capacitors 111 and 203 are also placed adjacent to inductor 110.

The arrangement of the components in FIG. 2, while simple to implement, brings about a few drawbacks. First, such an arrangement takes up substantial board space, since each of the aforementioned components occupies a different area on a board surface. Second, relatively long board traces are needed to connect between the components, leading to huge parasitic capacitance at some of the critical nodes. For example, as shown in FIG. 2, the length of LX node 109 is about 3 cm. As LX node 109 an intermediate node for charging and discharging of inductor 110 and capacitor 111, by first and second transistors 107 and 108, reducing the length of LX node 109 and the associated parasitic capacitance can reduce switching loss and improve the efficiency of the power converter.

FIG. 3 illustrates an approach of component arrangement to form the switching regulator 102 of FIG. 1, for reducing the board space. As shown in FIG. 3, switching regulator 300 includes a controller chip 302 which can include, for example, controller 104 and switching circuit 116 of FIG. 1. Switching regulator 300 also includes inductor 110, which is housed inside an inductor housing 304. Inductor housing 304 also houses internal wires 309a-b, with wire 309a soldered to board 306 at solder pad 308a. Controller chip 302 also includes controller pads 307a and 307b which provide electrical connection to internal components of controller chip 302 (e.g., switching circuit 116 at LX node 109). To reduce the space occupied by switching regulator 300, controller chip 302 is disposed on top of inductor housing 304. Bond wire 310a is configured to provide electrical connection between controller pads 307a and solder pad 308a, thereby providing electrical connection between inductor 110 and controller chip 302 (e.g., LX node 109). Bond wire 310b is configured to provide electrical connection between controller pads 307b and solder pad 308b on the board. Solder pad 308b enables controller chip 302 to be electrically connected to other components on board 306.

While the arrangement shown in FIG. 3 reduces the board space required for placing controller chip 202 and inductor housing 304, the bond wires 310a and 310b are still relatively long, and can contribute to considerable amount of parasitic capacitance and resistance.

FIG. 4 illustrates an approach of component arrangement for addressing the drawbacks of FIG. 3. As shown in FIG. 4, switching regulator 400 includes a controller chip 402 which can include, for example, controller 104 and switching circuit 116 of FIG. 1. Controller chip 402 can be a flip-chip device and include solder balls 408a-b, which can act as terminals configured to provide electrical connections to, for example, controller 104 and switching circuit 116 disposed within controller chip 402. Switching regulator 400 also includes inductor 110, which is housed inside an inductor housing 404. Inductor housing 404 includes solder pads 410 configured to provide electrical connections to inductor 110 via internal wires 409a. As shown in FIG. 4, inductor 110 is electrically connected to controller chip 402 via solder ball 408a and solder pads 410. Inductor housing 404 is disposed on board 406. To reduce the space occupied by switching regulator 400, controller chip 402 is disposed on top of inductor housing 404.

With the arrangement of FIG. 4, where the electrical connections between controller chip 402 and inductor housing 404 are provided by solder balls and pads, the parasitic capacitance associated with those electrical connections (including those for LX node 109) can be reduced. However, there are still numerous drawbacks with the arrangement of FIG. 4. First, while the solder pads and solder balls provide good electrical connections between the inductor and the controller (e.g., the LX node), they are exposed to the environment, and noises can be coupled into the electrical connection. The noise can affect the voltage output of switching regulator 400. Second, with controller 402 separated from board 406 by inductor housing 404, the arrangement of FIG. 4 can degrade other electrical connections for controller 402, such as yin 114, GND 115, vout 112, etc. Long bond wires may still be needed to providethese electrical connections, which can contribute considerable amount of parasitic capacitance and resistance to those connections.

Therefore, while the arrangement of FIG. 4 improves the electrical connection between the controller and the inductor, it can degrade the rest of the electrical connections for the controller, and the performance of switching regulator 400 can still be compromised.

Hence, there is a need for a technique to arrange the components of switching regulator, not only to reduce the board area requirement but also to provide good electrical connections and good insulation for all of the components, such that the regulator can be made more compact and can be more easily fitted into devices of small form factors, such as mobile phones.

SUMMARY

A switching regulator may include an inductor housing, a board, and one or more electrical components. The inductor housing may house an inductor and one or more wires. The board may include one or more board traces and one or more solder pads. The electrical components may include one or more chips, capacitors, voltage sources, and/or other electrical components. The inductor housing may be attached to the board to create a space between the inductor housing and the board. The space may be created underneath the inductor housing and above the board. One or more electrical components may be attached to the board. One or more electrical components may be disposed within the space.

In one aspect of the disclosure, the switching regulator may include a chip. The chip may include a flip chip. The chip may include a first terminal. The chip may be attached to the board and disposed within the space. The inductor housing may house a first wire electrically coupled to the inductor. The board may include a first board trace. The first board trace may electrically couple the first terminal with the first wire. In some implementations, the inductor may be disposed over the chip. In some implementations, the board may include a first solder pad and a second solder pad electrically coupled via the first board trace. The first solder pad may be soldered to the first wire and the second solder pad may be soldered to the first terminal. In some implementations, the board may include a groove that includes a surface. The chip and the inductor housing may be attached to the surface of the groove. In some implementations, the inductor housing may be mounted on the chip using a non-conductive adhesive. The non-conductive adhesive may include a non-conductive die-attach-film.

In some implementations, the switching regulator may include a capacitor. The capacitor may include a second terminal. The capacitor may be attached to the board and disposed within the space. The inductor housing may house a second wire electrically coupled to the inductor. The board may include a second board trace. The second board trace may electrically couple the second terminal with the second wire. In some implementations, the board may include a third solder pad and a fourth solder pad electrically coupled via the second board trace. The third solder pad may be soldered to the second wire and the fourth solder pad may be soldered to the second terminal. In some implementations, the capacitor may be attached to the surface of the groove.

In another aspect of the disclosure, the switching regulator may include a chip and a voltage source. The chip may include a flip chip. The chip may include a first terminal. The voltage source and the inductor housing may be attached to a first surface of the board. The voltage source may be disposed within the space. The chip may be attached to a second surface of the board. The chip may not be disposed within the space. The inductor housing may house a first wire electrically coupled to the inductor. The board may include a first board trace. The first board trace may electrically couple the first terminal with the first wire. In some implementations, the board may include a first solder pad and a second solder pad electrically coupled via the first board trace. The first solder pad may be soldered to the first wire and the second solder pad may be soldered to the first terminal. In some implementations, the board may include a groove that includes the second surface. In some implementations, the inductor housing may be mounted on the voltage source using a non-conductive adhesive. The non-conductive adhesive may include a non-conductive die-attach-film.

In some implementations, the switching regulator may include a capacitor. The capacitor may include a second terminal. The capacitor may be attached to the second surface of the board. The capacitor may not be disposed within the space. The inductor housing may house a second wire electrically coupled to the inductor. The board may include a second board trace. The second board trace may electrically couple the second terminal with the second wire. In some implementations, the board may include a third solder pad and a fourth solder pad electrically coupled via the second board trace. The third solder pad may be soldered to the second wire and the fourth solder pad may be soldered to the second terminal.

In another aspect of the disclosure, a switching regulator system may include an inductor housing and a board. The inductor housing may include an inductor, a first wire coupled to the inductor, and a second wire coupled to the inductor. The board may include a first board trace and a second board trace. The first board trace may be configured to be coupled to the first wire and the second board trace may be configured to be coupled to the second wire. The inductor housing may be configured to be attached to the board to create a space between the inductor housing and the board. One or more electrical components may be disposed within the space.

These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

Figure 1:
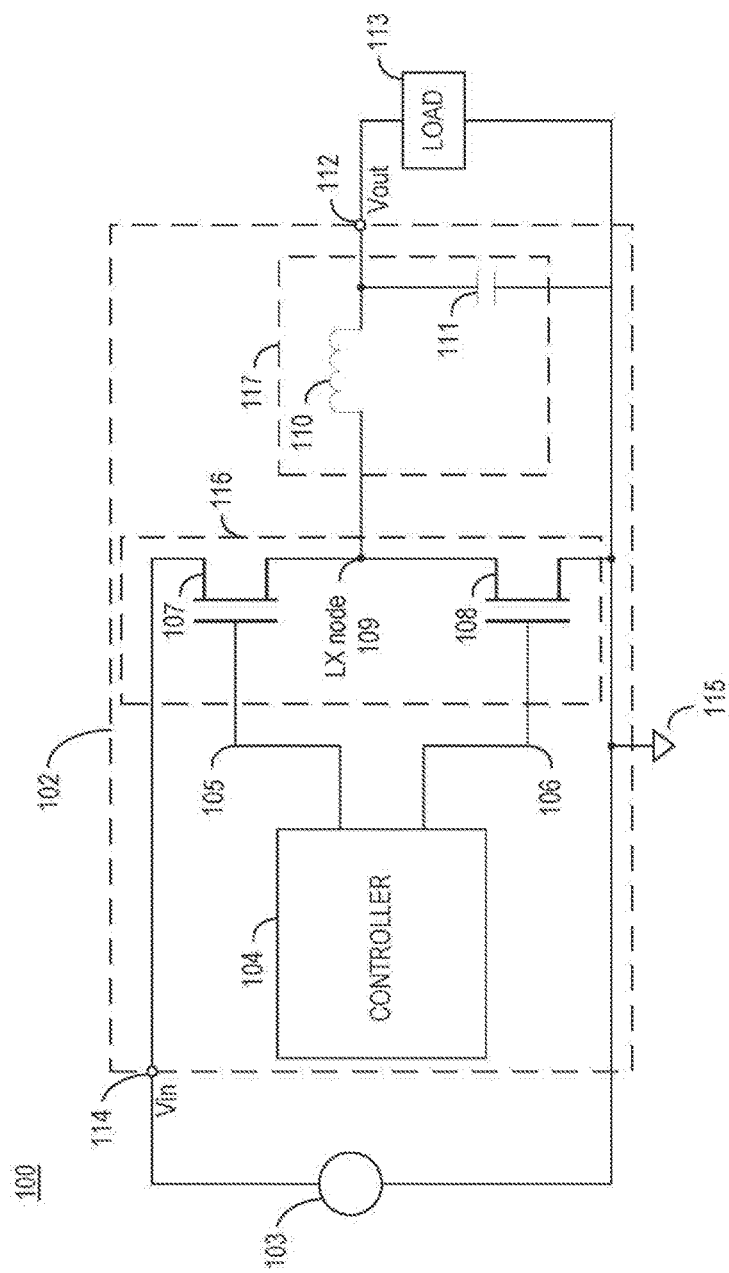
FIG. 1 is a block diagram of a buck switching regulator.
Figure 5:
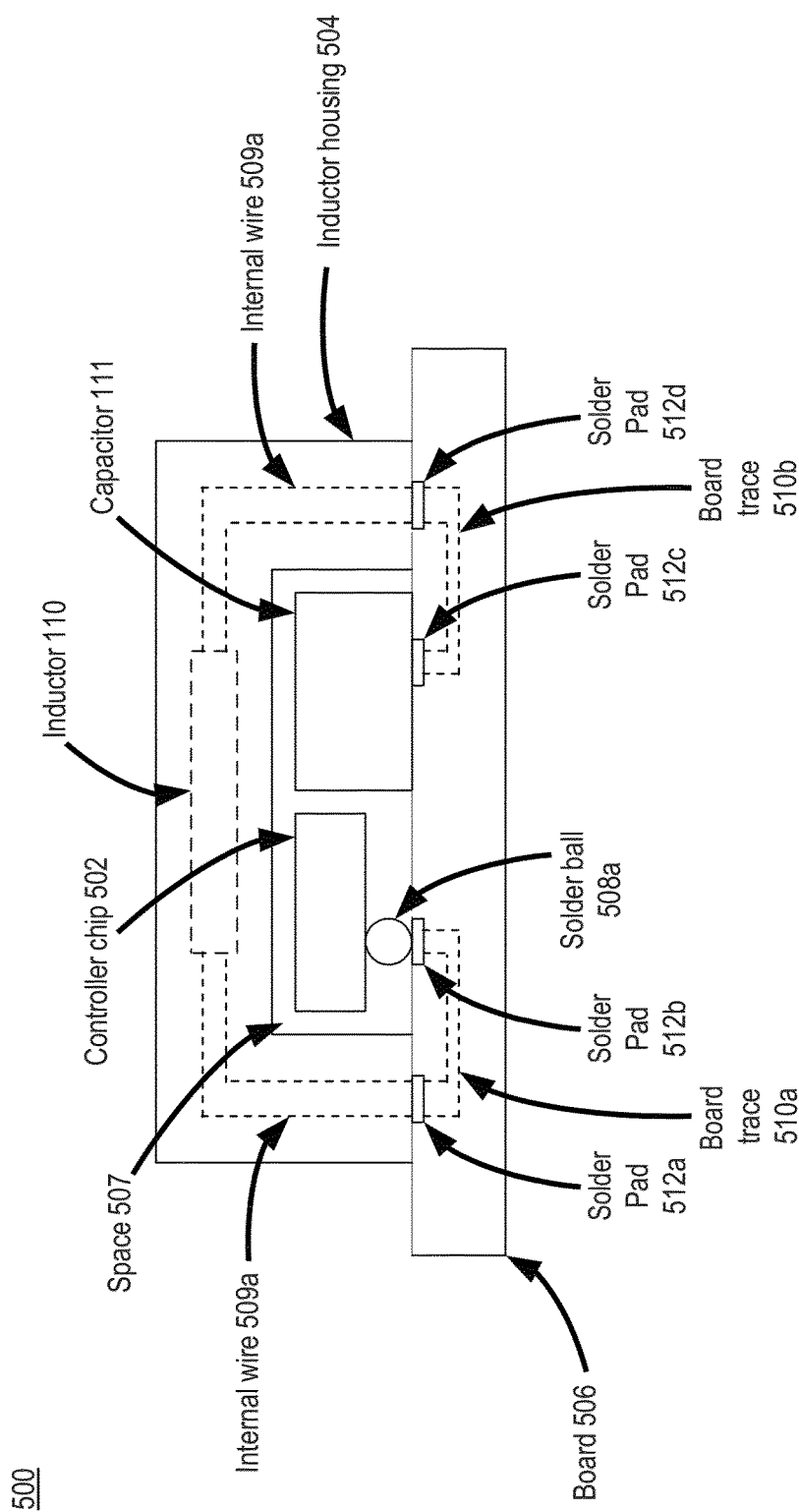
FIG. 5 is a schematic illustrating an exemplary switching regulator consistent with embodiments of the present disclosure.

FIG. 5 illustrates an exemplary switching regulator 500 consistent with embodiments of the present disclosure. As shown in FIG. 5, switching regulator 500 includes a controller chip 502 which can include, for example, controller 104 and switching circuit 116 of FIG. 1. Switching regulator 500 also includes inductor 110, which is housed inside an inductor housing 504 and is raised above board 506, creating a space 507 underneath the inductor. Controller 502 and other components of switch regulator 500 (e.g., capacitor 111) can be disposed within space 507 underneath inductor 110 and attached to board 506. In some embodiments, inductor housing 504 can be mounted on controller chip 502 using a non-conductive die-attach-film (DAF) or any other non-conductive adhesive, to further strength the attachment of controller chip 502 to board 506.

As shown in FIG. 5, inductor housing 504 also houses internal wires 509a and 509b, while board 506 also includes board traces 510a-b and solder pads 512a-d. Controller chip 502 can be a flip-chip device and include solder ball 508a, which can be configured as a terminal of controller chip 502, and can be soldered to solder pads 512b. Controller chip 502 can also include solder ball 508b (not shown in FIG. 5) configured to be soldered to other solder pads of board 506 (not shown in FIG. 5) to form other electrical connections (e.g. GND 115). Internal wire 509a can also be soldered to solder pad 512a. With board trace 510a providing electrical connection between solder pads 512a-b, an electrical connection can be formed between inductor 110 and controller chip 502 (e.g., LX node 109). Moreover, with capacitor 111 soldered to solder pad 512c and internal wire 509b soldered to solder pad 512d, and board trace 510b providing electrical connection between solder pads 512c-d, an electrical connection can also be formed between inductor 110 and capacitor 111 (e.g., vout 112).

With an arrangement according to FIG. 5, inductor 110 and controller chip 502 can be vertically stacked instead of being disposed side-by-side, thereby less board space is required to place these components. Moreover, the amount of noise coupled into the electrical connection between having inductor 110 and controller chip 502 can be reduced, since inductor 110 and controller chip 502 are electrically insulated except at the points of electrical contacts (e.g., at solder pads 512b-c and solder balls 508a-b), while majority of the electrical connections (e.g. internal wires 509a-b, board traces 510a-b) are also insulated from the environment. Furthermore, both the internal wires 509a-b and board traces 510a-b can be made very short, giving good electrical connections between inductor 110 and controller chip 502. This is because the length of internal wires 509a-b is largely determined by thickness of space 507, which is typically in the order of millimeters to accommodate the thickness of a controller chip or of a capacitor. Board traces 510a-b can also be made very short if solder ball 508a-b is at a short distance from internal wires 509a-b, which is the case when controller chip 502 and capacitor 111 are disposed beneath inductor 110. Lastly, unlike switch regulator 400 in which the controller chip is raised from the board, in switch regulator 500 the controller chip is attached to the board, and can have good electrical connections with other components (e.g., input power supply, ground, etc.) via other board traces embedded within board 506 (not shown in FIG. 5). Likewise, inductor 110 can also be connected to other components via board traces. As a result, with an arrangement according to FIG. 5, not only that the components will occupy less board space, but also that good electrical connection, via the board traces, as well as good insulation can be provided between the components.

Figure 6:
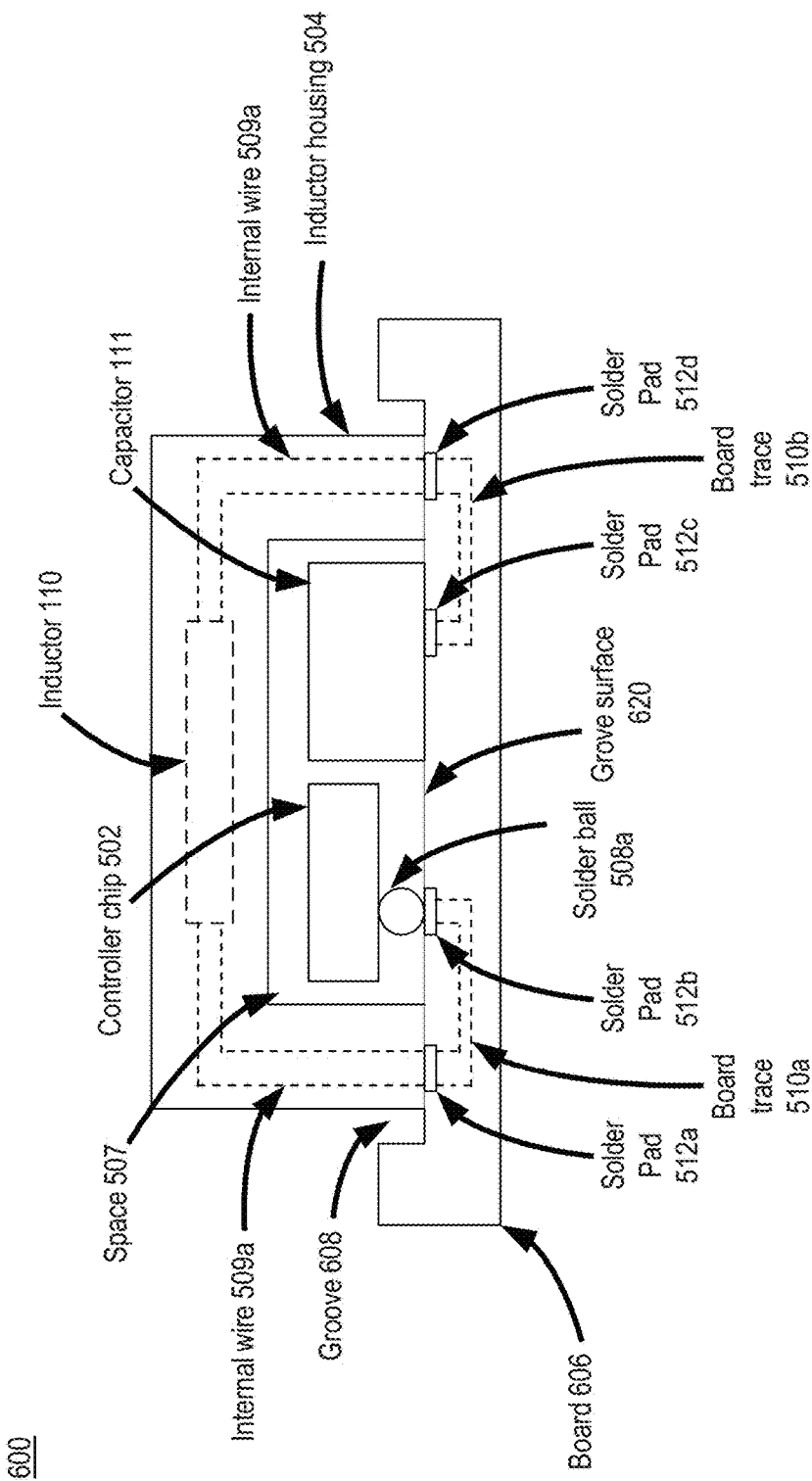
FIG. 6 is a schematic illustrating an exemplary switching regulator consistent with embodiments of the present disclosure.

FIG. 6 illustrates an exemplary switching regulator 600 consistent with embodiments of the present disclosure. As shown in FIG. 6, switching regulator 600 includes most of the components of switching regulator 500, except that board 606, on which controller chip 502, capacitor 111, and inductor housing 504 are mounted, includes a groove 608. Solder pads 512a-d can be disposed on a groove surface 620 of groove 608, and broad traces 510a-b can also disposed under groove surface 620. Controller chip 502, capacitor 111, and inductor housing 504 can be mounted on groove surface 620 and soldered to solder pads 512a-d.

In addition to reducing board space requirement and providing good electrical connection and insulation among the components, the arrangement as shown in FIG. 6 also reduces a vertical height of switching regulator 600 compared to switching regulator 500. As a result, switching regulator 600 can be made even more compact than switching regulator 500.

Figure 7:
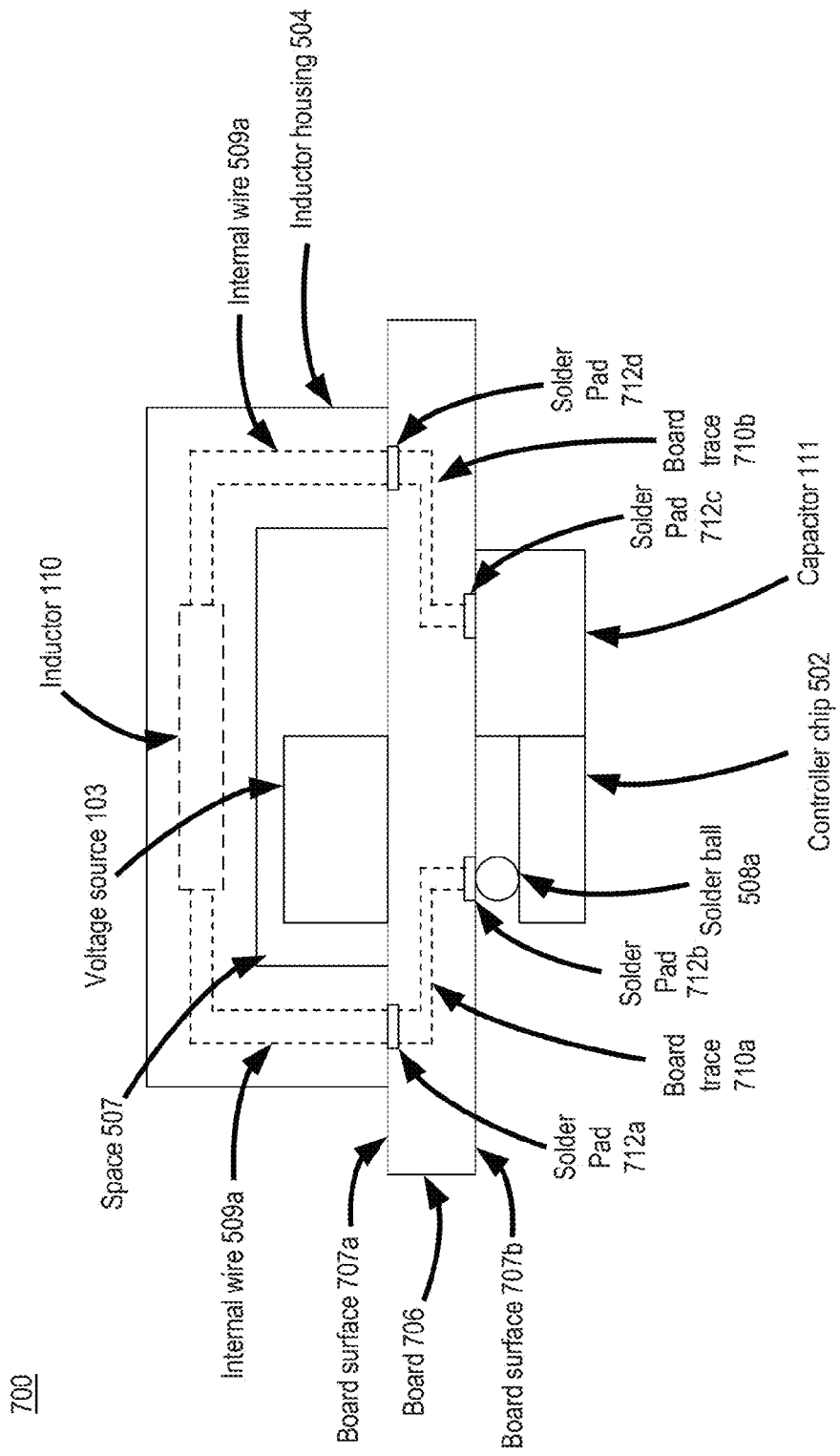
FIG. 7 is a schematic illustrating an exemplary switching regulator consistent with embodiments of the present disclosure.

FIG. 7 illustrates an exemplary switching regulator 700 consistent with embodiments of the present disclosure. As shown in FIG. 7, switching regulator 700 includes controller chip 502, capacitor 111, and inductor 110, which is housed inside inductor housing 504 and is raised above board 706, creating a space 507 underneath the inductor. Space 507 can be used to accommodate, for example voltage source 103 of FIG. 1, which provides the input voltage to switching regulator 700. In this embodiment, inductor housing 504 is disposed on board surface 707a, while controller chip 502 and capacitor 111 are disposed on board surface 707b, which is on an opposite side to board surface 707a. Board 706 further includes solder pads 712a and 712d on board surface 707a, and solder pads 712b and 712c on board surface 707b. Solder pads 712a and 712b are electrically connected via board trace 710a, and solder pads 712c and 712d are electrically connected via board trace 710b. Internal wires 509a and 509b can be soldered to solder pads 712a and 712d, while capacitor 111, as well as solder ball 508a of controller chip 502, can be soldered to solder pads 712b and 712c, to form the electrical connections for LX node 109 and vout 112.

With an arrangement according to FIG. 7, inductor 110 and controller chip 502 can be vertically stacked instead of being disposed side-by-side, thereby less board space is required to place these components. Besides, by distributing the components between two opposite sides of board 706, the board space requirement can be further reduced, and switching regulator 700 can be made even more compact than, for example, switching regulators 500 and 600 of FIGS. 5 and 6, while at the same time retaining the advantages provided by switching regulators 500 and 600, which include providing good insulation for the controller chip and for the inductor to reduce noise coupling, as well as good electrical connections between the components.

Figure 8:
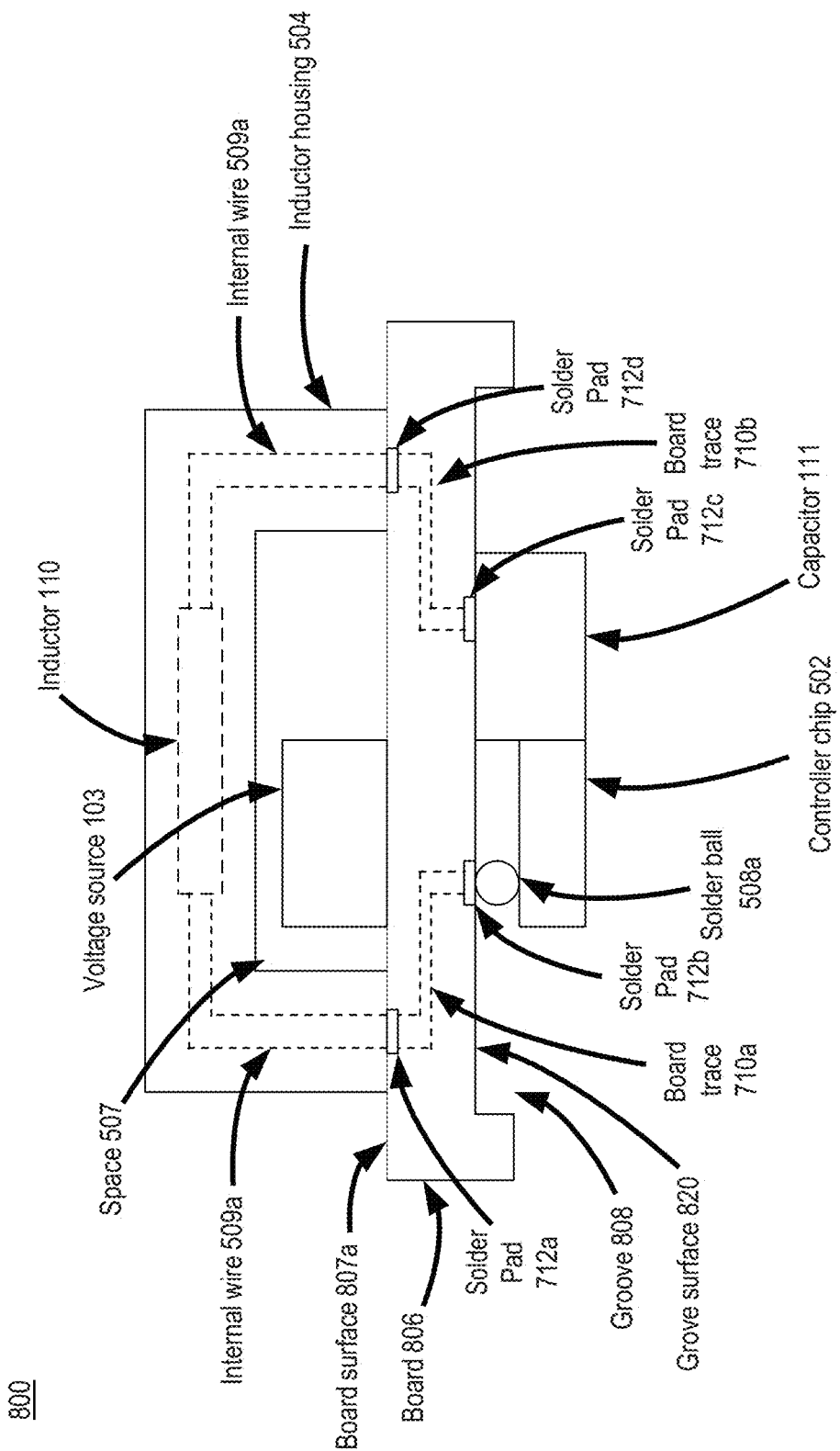
FIG. 8 is a schematic illustrating an exemplary switching regulator consistent with embodiments of the present disclosure.

FIG. 8 illustrates an exemplary switching regulator 800 consistent with embodiments of the present disclosure. As shown in FIG. 8, switching regulator 800 includes most of the components of switching regulator 700, except that board 806, on which controller chip 502, capacitor 111, and inductor housing 504 are mounted, includes a groove 808. Solder pads 712b and 712c can be disposed on a groove surface 820 of groove 808. Controller chip 502 and capacitor 111 can be mounted on groove surface 820 and soldered to solder pads 712b and 712c.

In addition to reducing board space requirement and providing good electrical connection among the components, the arrangement as shown in FIG. 8 also reduces a vertical height of switching regulator 800 compared to switching regulator 700. As a result, switching regulator 800 can be made even more compact than switching regulator 700.

Figure 2:
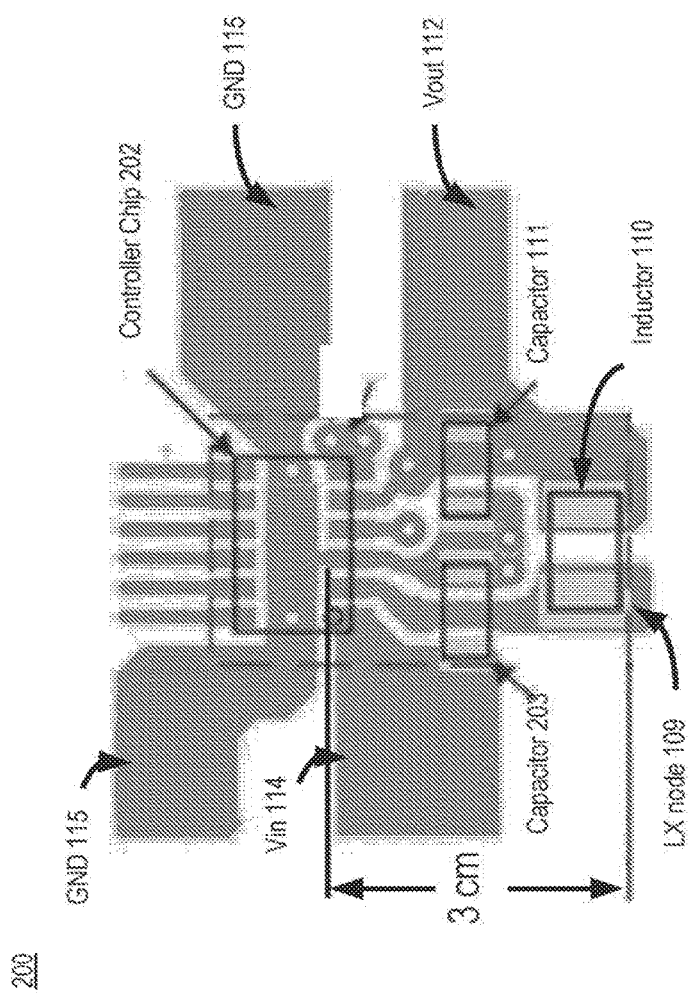
FIG. 2 is a printed circuit board (PCB) layout illustrating a placement of components of a buck switching regulator.
Figure 3:
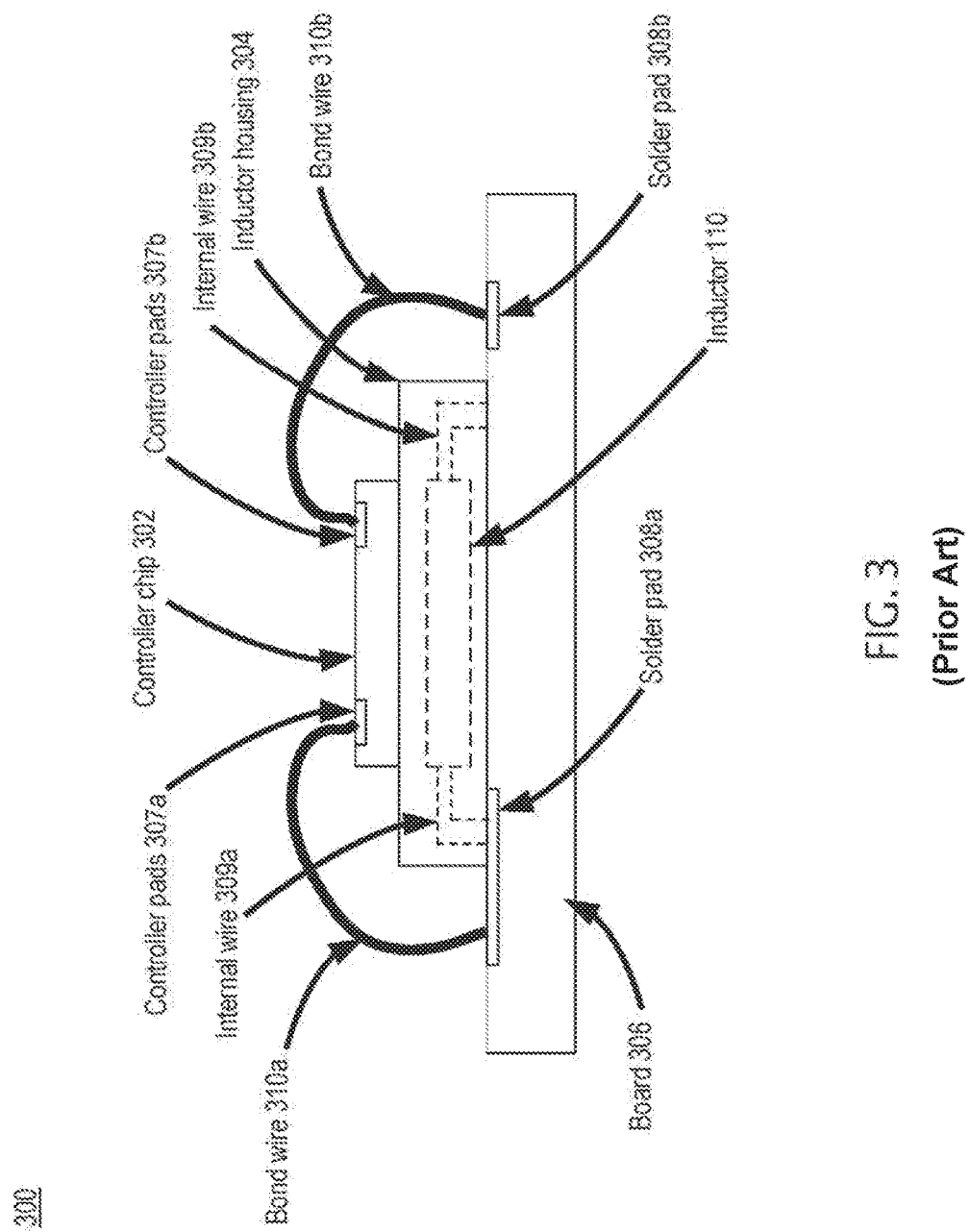
FIG. 3 is a schematic illustrating another placement of components of a buck switching regulator.
Figure 4:
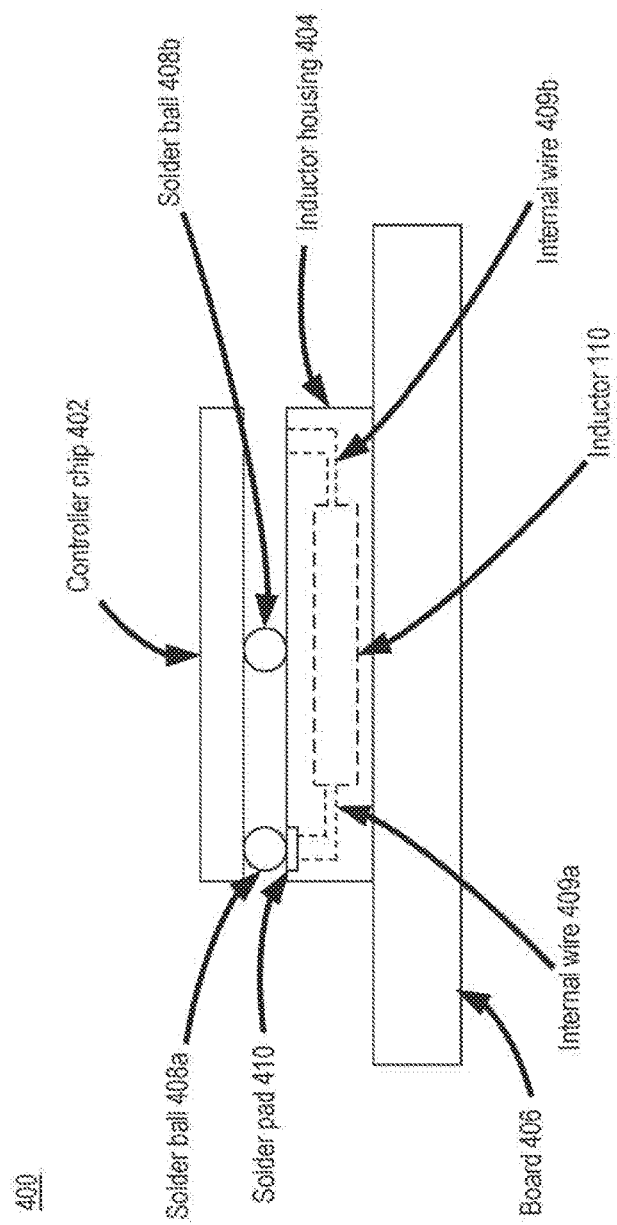
FIG. 4 is a schematic illustrating another placement of components of a buck switching regulator.
Figure 9:
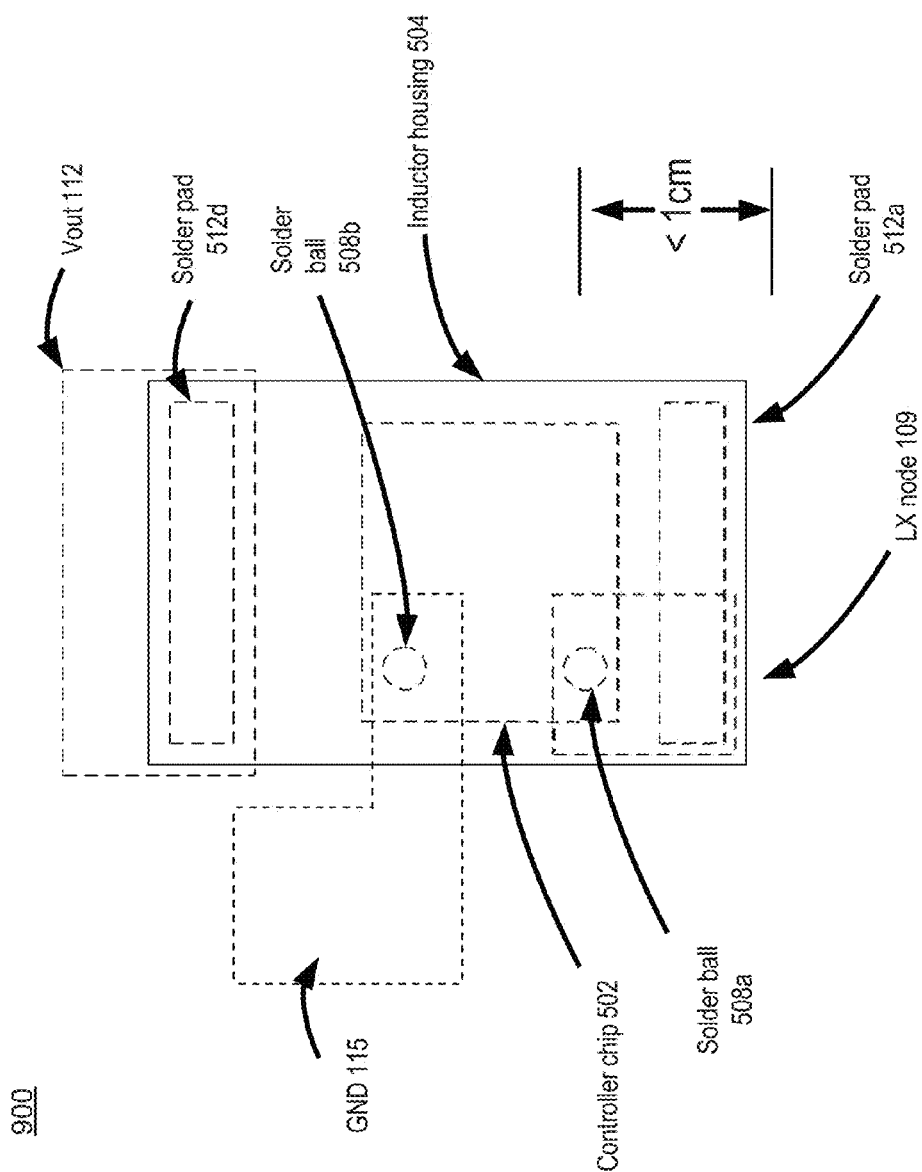
FIG. 9 is a printed circuit board (PCB) layout illustrating the placement of components of an exemplary switching regulator consistent with embodiments of the present disclosure.

FIG. 9 is a printed circuit board (PCB) layout 900 illustrating the placement of components of an exemplary switching regulator (e.g., switching regulator 500 of FIG. 5). As shown in FIG. 9, controller chip 502 is disposed underneath inductor housing 504 (which houses inductor 110). As a result, the connection between controller chip 502 and inductor 110, such as LX node 109, can be made very short (less than 1 cm, compared with 3 cm as shown in FIG. 2), and can be provided by a board trace embedded in the PCB, providing good electrical connection and insulation. Also, solder ball 508b of controller chip 502 can be soldered to board traces for other electrical connections (e.g., GND 115), therefore good electrical connections can be provided for all of the nodes in connection with controller chip 502. Other electrical connections, such as vout 112, can be made very short, as capacitor 111 (not shown in FIG. 9) can also be disposed underneath inductor housing 504 (and inductor 110).

Reference throughout this specification to "an embodiment," "some embodiments," "one embodiment", "another example," "an example," "a specific examples," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example, "in an example," "in a specific examples," or "in some examples," in various places throughout this specification are not necessarily referring to the same embodiment or example of the present disclosure. Furthermore, the particular features, structures, materials, or characteristics may be combined in any suitable manner in one or more embodiments or examples.

The description of the embodiments is only exemplary, and is not intended to be limiting. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions. In this regard, directional terminology, such as "top," "bottom," "front," "back," "leading," "trailing," etc., is used with reference to the orientation of the figure(s) being described. Because components of embodiments of the present disclosure can be positioned in a number of different orientations, the directional terminology is used for purposes of illustration and is in no way limiting.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A switching regulator, comprising:
  an inductor housed in an inductor housing;
  a first wire electrically coupled to the inductor and housed in the inductor housing;
  a chip including a first terminal; and
  a board including a first board trace, the first board trace electrically coupling the first terminal with the first wire;
  wherein:
    the chip and the inductor housing are attached to the board;
    the attachment of the inductor housing to the board creates a space between the inductor housing and the board; and
    the chip is disposed within the space.

2. The switching regulator of claim 1, wherein the inductor is disposed over the chip.

3. The switching regulator of claim 1, wherein the board further includes a first solder pad and a second solder pad electrically coupled via the first board trace, the first solder pad soldered to the first wire housed in the inductor housing and the second solder pad soldered to the first terminal.

4. The switching regulator of claim 1, wherein the board further includes a groove that includes a surface; wherein the chip and the inductor housing are attached to the surface of the groove.

5. The switching regulator of claim 1, further comprising:
a second wire electrically coupled to the inductor and housed in the inductor housing; and
a capacitor including a second terminal;
wherein:
the board further includes a second board trace, the second board trace electrically coupling the second terminal with the second wire;
the capacitor is attached to the board; and
the capacitor is disposed within the space.

6. The switching regulator of claim 5, wherein the board further includes a third solder pad and a fourth solder pad electrically coupled via the second board trace, the third solder pad soldered to the second wire housed in the inductor housing and the fourth solder pad soldered to the second terminal.

7. The switching regulator of claim 1, wherein the inductor housing is mounted on the chip using a non-conductive adhesive.

8. The switching regulator of claim 7, wherein the non-conductive adhesive includes a non-conductive die-attach-film.

9. The switching regulator of claim 1, wherein the chip includes a flip chip.

10. A switching regulator, comprising:
an inductor housed in an inductor housing;
a first wire electrically coupled to the inductor and housed in the inductor housing;
a chip including a first terminal;
a voltage source; and
a board including a first board trace, the first board trace electrically coupling the first terminal with the first wire;
wherein:
the voltage source and the inductor housing are attached to a first surface the board;
the chip is attached to a second surface of the board;
the attachment of the inductor housing to the first surface of the board creates a space between the inductor housing and the board; and
the voltage source is disposed within the space.

11. The switching regulator of claim 10, wherein the board further includes a first solder pad and a second solder pad electrically coupled via the first board trace, the first solder pad soldered to the first wire housed in the inductor housing and the second solder pad soldered to the first terminal.

12. The switching regulator of claim 10, wherein the board further includes a groove that includes the second surface.

13. The switching regulator of claim 10, further comprising:
a second wire electrically coupled to the inductor and housed in the inductor housing; and
a capacitor including a second terminal;
wherein:
the board further includes a second board trace, the second board trace electrically coupling the second terminal with the second wire; and
the capacitor is attached to the second surface of the board.

14. The switching regulator of claim 13, wherein the board further includes a third solder pad and a fourth solder pad electrically coupled via the second board trace, the third solder pad soldered to the second wire housed in the inductor housing and the fourth solder pad soldered to the second terminal.

15. The switching regulator of claim 10, wherein the inductor housing is mounted on the voltage source using a non-conductive adhesive.

16. The switching regulator of claim 15, wherein the non-conductive adhesive includes a non-conductive die-attach-film.

17. The switching regulator of claim 10, wherein the chip includes a flip chip.

18. A switching regulator system, comprising:
an inductor housing including an inductor, a first wire coupled to the inductor, and a second wire coupled to the inductor; and
a board including a first board trace and a second board trace, the first board trace configured to be coupled to the first wire and a first terminal of a given electrical component to electrically couple the first terminal with the first wire, the second board trace configured to the coupled to the second wire;
wherein the inductor housing is configured to be attached to the board to create a space for one or more electrical components between the inductor housing and the board, the one or more electrical components including the given electrical component.

19. The switching regulator system of claim 18, wherein the one or more electrical components include a chip and a capacitor.

20. The switching regulator system of claim 18, wherein the one or more electrical components include a voltage source.

* * * * *